(12) United States Patent
Bruce et al.

(10) Patent No.: US 10,276,384 B2
(45) Date of Patent: Apr. 30, 2019

(54) PLASMA SHALLOW DOPING AND WET REMOVAL OF DEPTH CONTROL CAP

(71) Applicants: International Business Machines Corporation, Armonk, NY (US); Tokyo Electron Limited, Hopewell Junction, NY (US)

(72) Inventors: Robert L. Bruce, White Plains, NY (US); Kevin K. Chan, Staten Island, NY (US); Sebastian U. Engelmann, White Plains, NY (US); Dario L. Goldfarb, Dobbs Ferry, NY (US); Marinus Hopstaken, Carmel, NY (US); Mahmoud Khojasteh, Poughkeepsie, NY (US); George G. Totir, Newtown, CT (US); Hongwen Yan, Somers, NY (US); Masahiro Yamazaki, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 15/419,065

(22) Filed: Jan. 30, 2017

(65) Prior Publication Data

US 2018/0218907 A1 Aug. 2, 2018

(51) Int. Cl.
*H01L 21/223* (2006.01)
*H01L 29/10* (2006.01)
(Continued)

(52) U.S. Cl.
CPC ...... *H01L 21/2233* (2013.01); *H01L 21/2236* (2013.01); *H01L 21/30612* (2013.01); *H01L 29/1029* (2013.01); *H01L 29/207* (2013.01)

(58) Field of Classification Search
CPC ............ H01L 21/2236; H01L 21/2233; H01L 21/2654
See application file for complete search history.

(56) References Cited

U.S. PATENT DOCUMENTS

| | | | |
|---|---|---|---|
| 2003/0096490 A1* | 5/2003 | Borland | H01L 21/2236 438/513 |
| 2010/0317166 A1* | 12/2010 | Lee | H01L 27/11578 438/268 |

(Continued)

OTHER PUBLICATIONS

Appendix P, 2018.

*Primary Examiner* — Jamie C Niesz
(74) *Attorney, Agent, or Firm* — Garg Law Firm, PLLC; Grant Johnson

(57) ABSTRACT

A gas is ionized into a plasma. A compound of a dopant is mixed into the plasma, forming a mixed plasma. Using a semiconductor device fabrication system, a layer of III-V material is exposed to the mixed plasma to dope the layer with the dopant up to a depth in the layer, forming a shallow doped portion of the layer. The depth of the dopant is controlled by a second layer of the dopant formed at the shallow doped portion of the layer. The second layer is exposed to a solution, where the solution is prepared to erode the dopant in the second layer at a first rate. After an elapsed period, the solution is removed from the second layer, wherein the elapsed period is insufficient to erode a total depth of the layer and the shallow doped portion by more than a tolerance erosion amount.

14 Claims, 10 Drawing Sheets

(51) Int. Cl.
*H01L 29/207* (2006.01)
*H01L 21/306* (2006.01)

(56) References Cited

U.S. PATENT DOCUMENTS

| | | | |
|---|---|---|---|
| 2012/0238074 A1* | 9/2012 | Santhanam | H01J 37/32412 438/468 |
| 2013/0137249 A1* | 5/2013 | Olsen | H01L 21/263 438/513 |
| 2015/0171104 A1* | 6/2015 | Prabhakar | H01L 27/11573 438/200 |
| 2017/0210617 A1* | 7/2017 | Sadaka | B81C 1/00158 |
| 2017/0373149 A1* | 12/2017 | Bruce | H01L 29/1041 |

* cited by examiner

PLASMA SHALLOW DOPING AND WET REMOVAL OF DEPTH CONTROL CAP

TECHNICAL FIELD

The present invention relates generally to a method, system, and computer program product for implanting dopants in semiconductor fabrication. More particularly, the present invention relates to a method, system, and computer program product for plasma shallow doping and wet removal of depth control cap.

BACKGROUND

An integrated circuit (IC) is an electronic circuit formed using a semiconductor material, such as Silicon, as a substrate and by adding (doping) impurities (dopants) to form solid-state electronic devices, such as transistors, diodes, capacitors, and resistors. The software tools used for designing ICs produce, manipulate, or otherwise work with the circuit layout and circuit components on very small scales. Some of the components that such a tool may manipulate may only measure a few nanometer across when formed in Silicon. The designs produced and manipulated using these software tools are complex, often including hundreds of thousands of such components interconnected to form an intended electronic circuitry.

Once a design layout, also referred to simply as a layout, has been finalized for an IC, the design is converted into a set of masks or reticles. During manufacture, a semiconductor wafer is exposed to radiation through a mask to form microscopic components of the IC. This process is known as photolithography. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

Many semiconductor devices are planar, i.e., where the semiconductor structures are fabricated on one plane. A non-planar device is a three-dimensional (3D) device where some of the structures are formed above or below a given plane of fabrication. A fin-Field Effect Transistor (finFET) is an example of a non-planar device.

Doping can be performed on a plane of a planar device, or on multiple planes of a non-planar device. Furthermore, an electrical characteristic, such as conductivity or resistivity of a layer, semiconducting behavior of a channel, and the like, are controllable through the type of dopant used for doping, a concentration of the dopant, and a depth to which the dopant is implanted into a given layer.

SUMMARY

The illustrative embodiments provide a method, system, and computer program product. An embodiment includes a method that ionizes a gas into a plasma. The embodiment mixes a compound of a dopant into the plasma, forming a mixed plasma. The embodiment exposes, using a semiconductor device fabrication system, a layer of III-V material to the mixed plasma to dope the layer with the dopant up to a depth in the layer, forming a shallow doped portion of the layer. The embodiment controls the depth of the dopant by a second layer of the dopant formed at the shallow doped portion of the layer. The embodiment exposes the second layer to a solution, the solution prepared to erode the dopant in the second layer at a first rate. The embodiment removes, after an elapsed period, the solution from the second layer, wherein the elapsed period is insufficient to erode a total depth of the layer and the shallow doped portion by more than a tolerance erosion amount.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
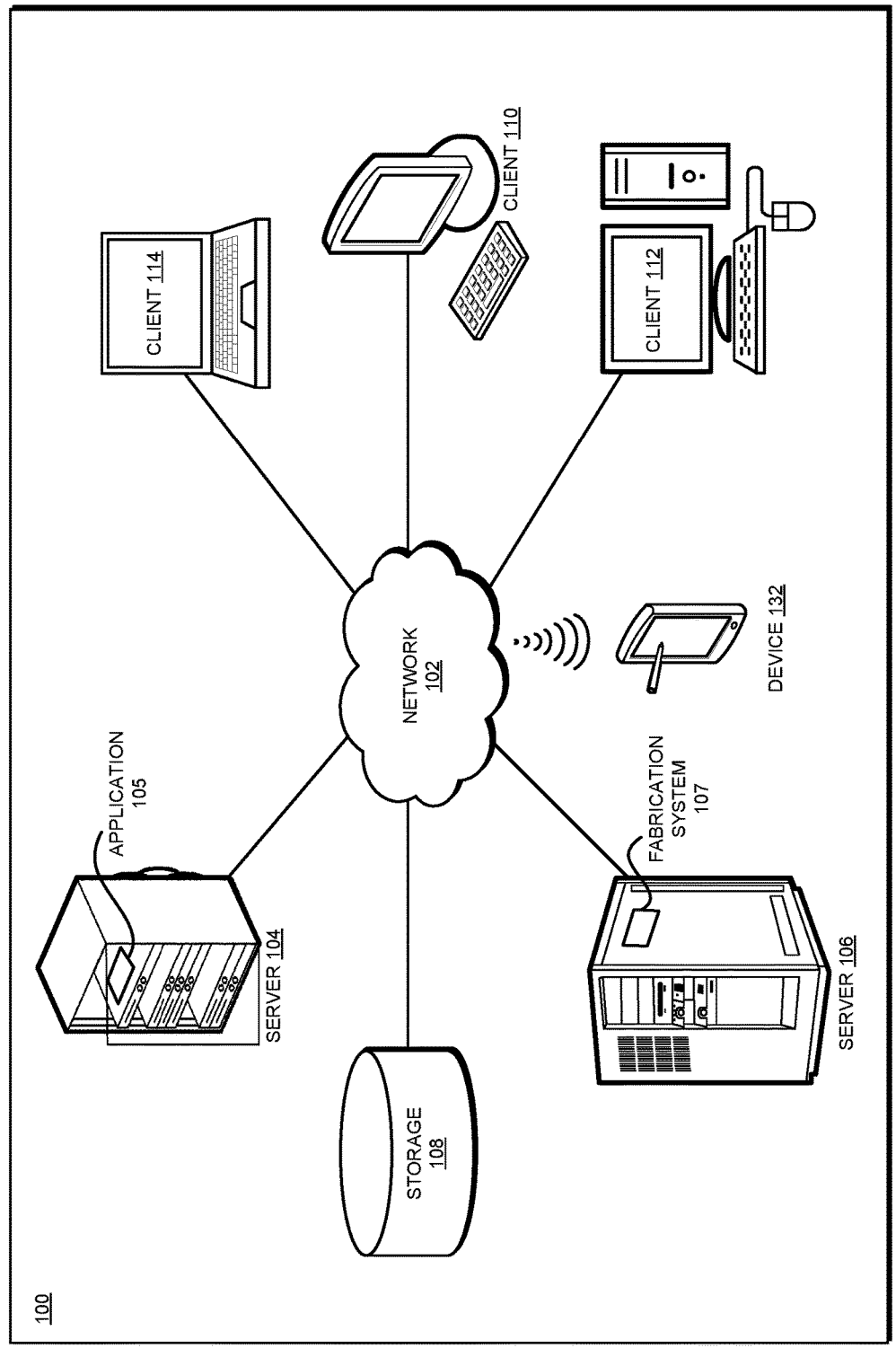
FIG. 1 depicts a block diagram of a network of data processing systems in which illustrative embodiments may be implemented.

The illustrative embodiments recognize that controlling doping depth is a difficult problem in semiconductor fabrication. As a non-limiting example, a III-V material layer, such as Indium-Gallium-Arsenide (InGaAs), has to be doped with Silicon (Si) or Germanium (Ge) in many circumstances.

For example, electron mobility may have to be improved in a InGaAs channel, for which shallow Si doping is needed.

To give some non-limiting examples, the InGaAs layer may be ten nanometer (nm) to one hundred nm or more deep. Accordingly, shallow doping would reach from low single digit nm depth to few tens of nm depth into the InGaAs layer, e.g., one-to-five nm to ten-to-thirty nm depth, respectively. Shallow doping is also known as surface doping.

The illustrative embodiments recognize that if Si is implanted too deep into the InGaAs channel, then the InGaAs and Si become diffused into one another, reducing electron mobility. Many other III-V materials have to be shallow implanted with Si or other similar dopants for these and other reasons.

The illustrative embodiments further recognize that controlling the depth of the doping, and the doping process generally is hindered by the oxides that form on the III-V material layer. If the oxide is not removed, the doping is at least not accomplished to a suitable depth, and can be ineffective at the worst.

Presently, Hydrochloric acid (HCl) or Hydrofluoric acid (HF) solution is used to remove oxidation in semiconductor fabrication. The illustrative embodiments recognize that InGaAs native oxides are not removable with this solution. If the native oxides are present on the surface where doping has to be applied, the surface doping is not effective.

The illustrative embodiments used to describe the invention generally address and solve the above-described problems and other problems related to shallow doping of III-V material layers. The illustrative embodiments provide a method for plasma shallow doping and wet removal of depth control cap.

An embodiment can be implemented as a software application. The application implementing an embodiment can be configured as a modification of an existing semiconductor fabrication system, as a separate application that operates in conjunction with an existing semiconductor fabrication system, a standalone application, or some combination thereof. For example, the application causes the semiconductor fabrication system to perform the steps described herein, to implant a dopant to a shallow depth and thereafter clean any structures created for the shallow doping, as described herein.

For the clarity of the description, and without implying any limitation thereto, the illustrative embodiments are described using a InGaAs as an example III-V material, Si as an example dopant, and Argon (Ar) as an example material in an ionized form in a plasma as described herein. An embodiment can be implemented with a different III-V materials—such as Gallium Arsenide Indium Phosphide, different dopants—such as Germanium, different plasma—such as ionized Helium, or some combination of these and other similarly purposed materials within the scope of the illustrative embodiments.

Furthermore, some compositions, dilutions, temperatures, durations, thicknesses, depths, and other measurements are described herein only as non-limiting examples. Some of these described measurements have been used in experimentations related to certain inventive aspects described herein, and are usable in a preferred embodiment. However, these examples of measurements are not intended to be limiting. From this disclosure, those of ordinary skill in the art will be able to conceive many other variations of the measurements, such as different compositions, dilutions, temperatures, durations, thicknesses, or depths, to achieve similar or comparable results as an embodiment, and such variations are contemplated within the scope of the illustrative embodiments.

Furthermore, a simplified diagram of an example transistor is used in the figures and the illustrative embodiments. In an actual fabrication of a semiconductor device, such as a finFET, additional structures that are not shown or described herein may be present, can be doped using an embodiment, or both, without departing the scope of the illustrative embodiments. Similarly, within the scope of the illustrative embodiments, a shown or described structure layer may be fabricated or implemented differently to yield a similar operation or result as described herein.

Differently shaded portions in the two-dimensional drawings are intended to represent different materials unless expressly described differently where used. The different materials may be replaced with other materials that are known to those of ordinary skill in the art as having a similar property as the described material.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in an actual shallow doping operation according to the illustrative embodiments.

Furthermore, the illustrative embodiments are described with respect to a transistor only as an example. The steps described by the various illustrative embodiments can be adapted for fabricating other planar and non-planar devices in a similar manner, and such adaptations are contemplated within the scope of the illustrative embodiments. Those of ordinary skill in the art will be able to use an embodiment to control the depth of doping in the fabrication of any device and in any plane of the device, and such usage is also contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The manner of plasma shallow doping and wet removal of depth control cap described herein is unavailable in the presently available methods. A method of an embodiment described herein, when implemented to execute on a device or data processing system, comprises substantial advancement of the functionality of that device or data processing system in fabricating semiconductor devices where the depth of implanting a dopant into a III-V material layer has to be controlled.

The illustrative embodiments are described with respect to certain types of devices, layers, planes, structures, materials, compositions, dilutions, temperatures, durations, thicknesses, depths, measurements, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
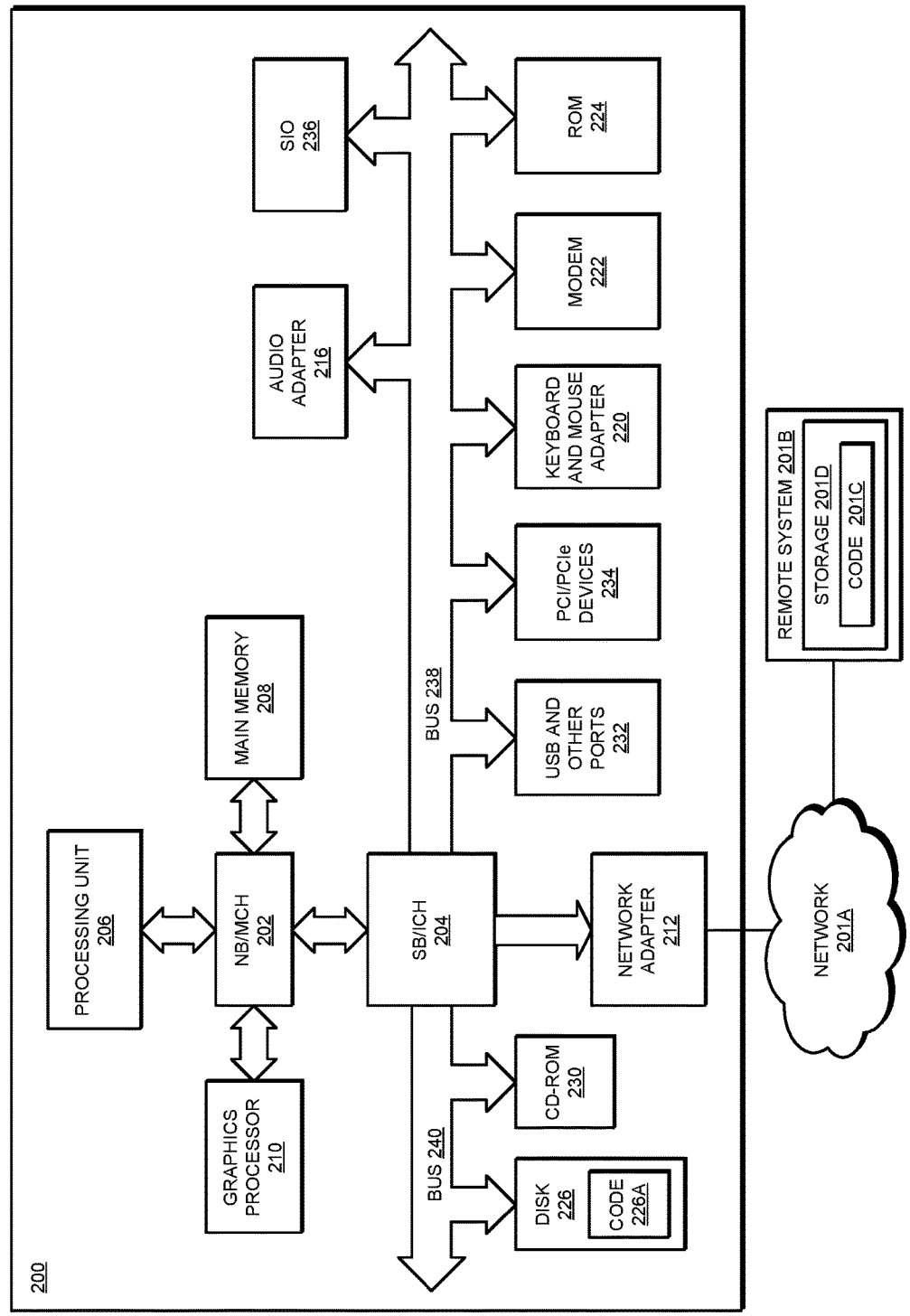
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for shallow doping of a III-V material layer in a manner described herein.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs memory controller hub (NB/MCH) 202 and input/output (I/O) controller hub (SB/ICH) 204. Processing unit 206, main memory 208, and graphics processor 210 are coupled in the example manner shown in this figure. Local area network (LAN) adapter 212, audio adapter 216, keyboard and mouse adapter 220, modem 222, read only memory (ROM) 224, universal serial bus (USB) and other ports 232, and PCI/PCIe devices 234 are coupled through bus 238. Hard disk drive (HDD) or solid-state drive (SSD) 226 and CD-ROM 230 are coupled through bus 240. A super I/O (SIO) device 236 may be coupled through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

Instructions for applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

Figure 3:
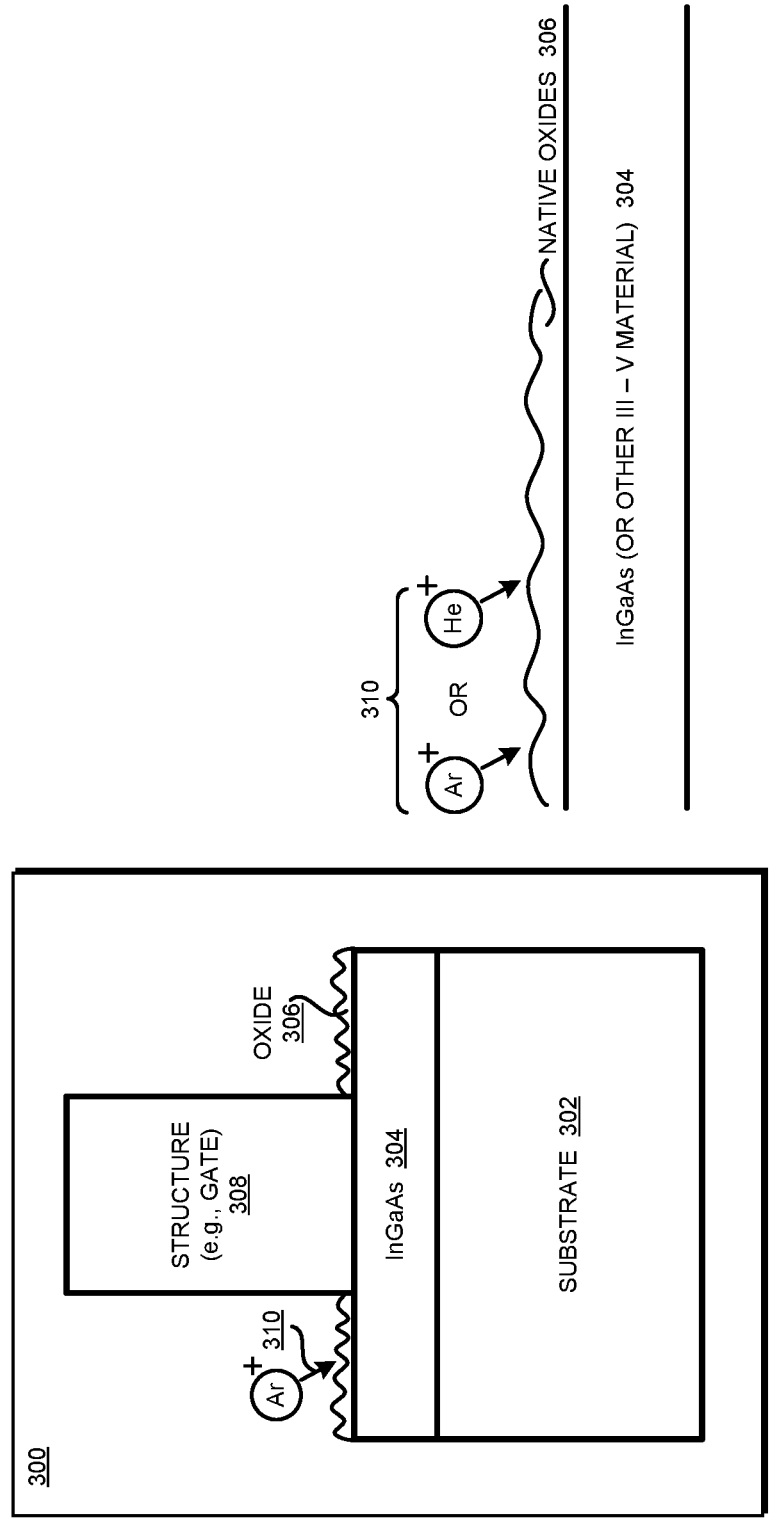
FIG. 3 depicts a block diagram of an example semiconductor device configuration in which a layer has to be shallow doped in accordance with an illustrative embodiment.

With reference to FIG. 3, this figure depicts a block diagram of an example semiconductor device configuration in which a layer has to be shallow doped in accordance with an illustrative embodiment. Application 105 in FIG. 1 interacts with fabrication system 107 to produce or manipulate configuration 300 as described herein.

Configuration 300 depicts substrate 302, which may be formed using Indium Phosphide (InP) or other suitable material. Layer 304 is a layer of an example III-V material, such as, but not limited to, InGaAs. Oxide layer 306 comprises native oxides of the III-V material, such as the oxides that are more stable than $In_2O$ or $Ga_2O$.

Structure 308 is an example gate structure, fabricated to create an example source and an example drain in layer 304.

An embodiment causes a fabrication system, such as fabrication system 107 in FIG. 1, to direct ionized plasma 310 at a portion of oxide 306. Generally, plasma 310 can be of any suitable material that is known to remove oxygen from the native oxide molecules in layer 306 and expose In– (In negative), Ga– (Ga negative), and/or As– (As negative) bonds in the III-V material. Preferably, the material of plasma is ionized Argon (Ar+, Ar positive) or Helium (He+, He positive).

Figure 4:
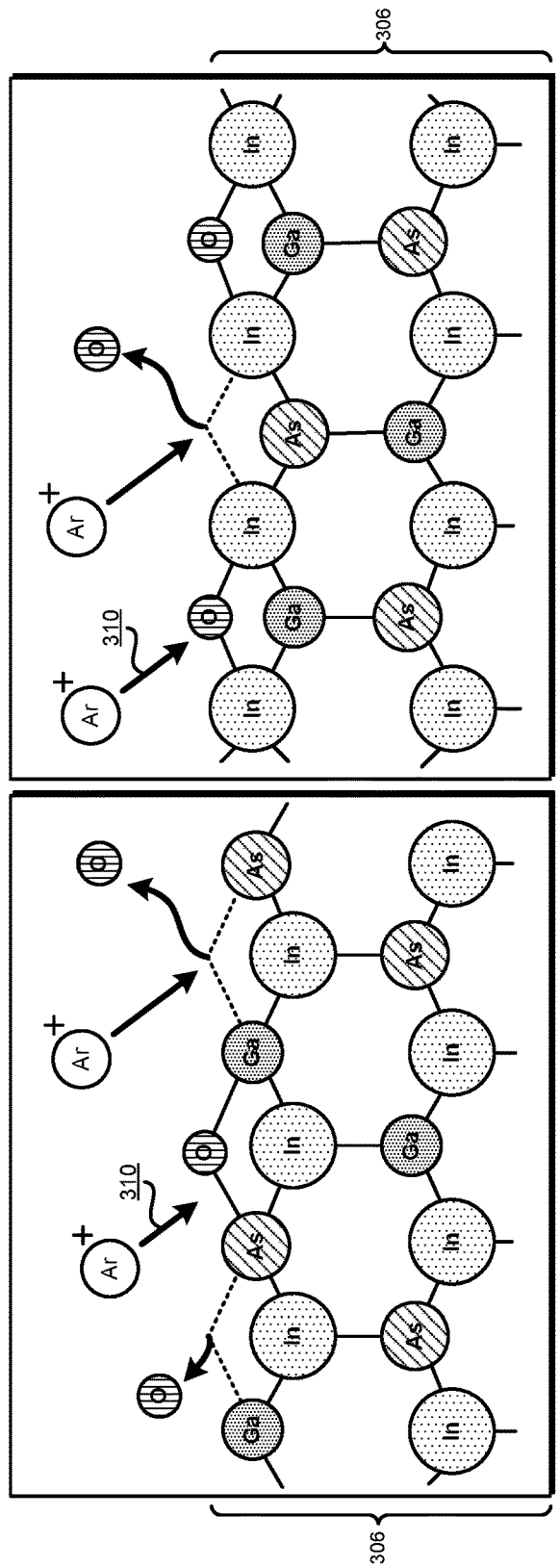
FIG. 4 depicts the example removal of oxygen from the native oxide molecules in accordance with an illustrative embodiment.

By removing the oxygen from the native oxides, plasma 310 cleans the surface in which shallow doping is to be performed. FIG. 4 depicts the example removal of oxygen from the native oxide molecules in accordance with an illustrative embodiment.

Figure 5:
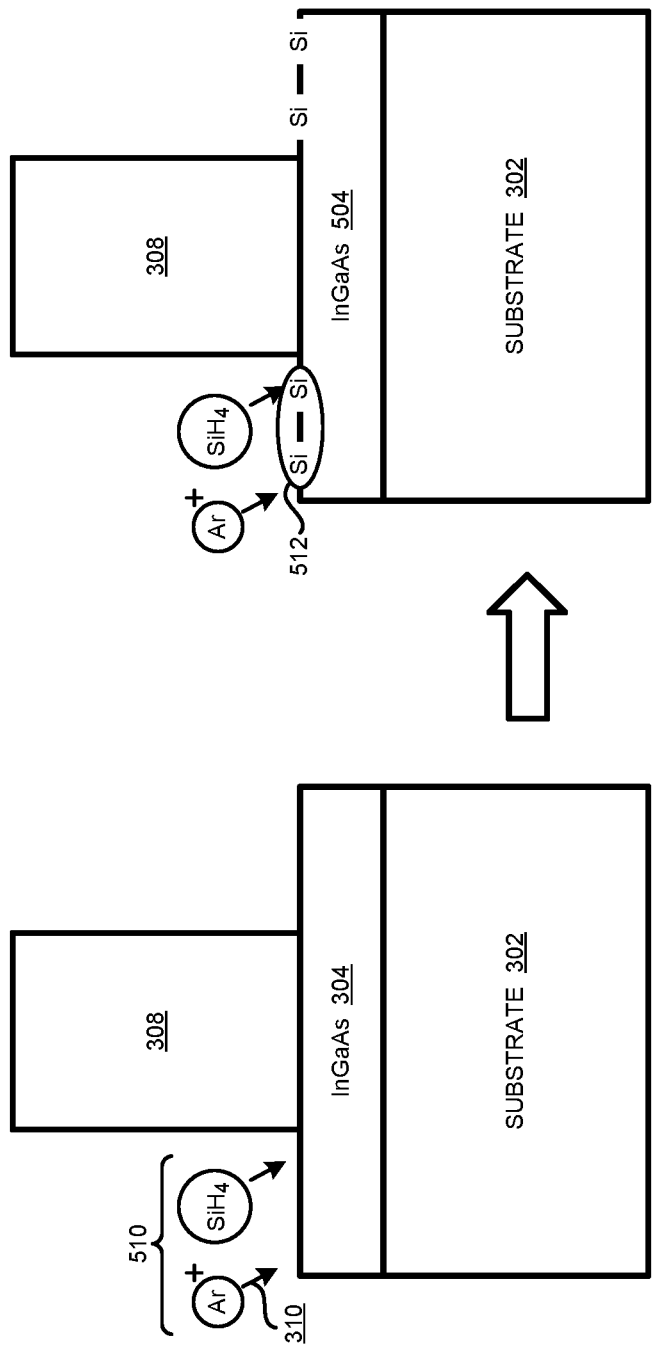
FIG. 5 depicts an example shallow doping process in accordance with an illustrative embodiment.

FIG. 5 depicts an example shallow doping process in accordance with an illustrative embodiment. Assume that the example III-V material of layer 304 is to be shallow doped with non-limiting example material Si. An embodiment causes the fabrication system to add silicon in a suitable form to plasma 310 of FIG. 3, thus forming plasma 510. Preferably, to shallow dope layer 304 with Si dopant, the embodiment causes plasma 510 to include Silane ($SiH_4$). Silane causes Si (512) to be incorporated into the III-V material of layer 304, forming layer 504. Adding Si deposition increases the radicals such as Si+, $SiH2+$, and/or $SiH3+$ in layer 504. Increased radicals in layer 504 cause the sheet resistivity (Rs) of layer 504 to reduce substantially.

Figure 6:
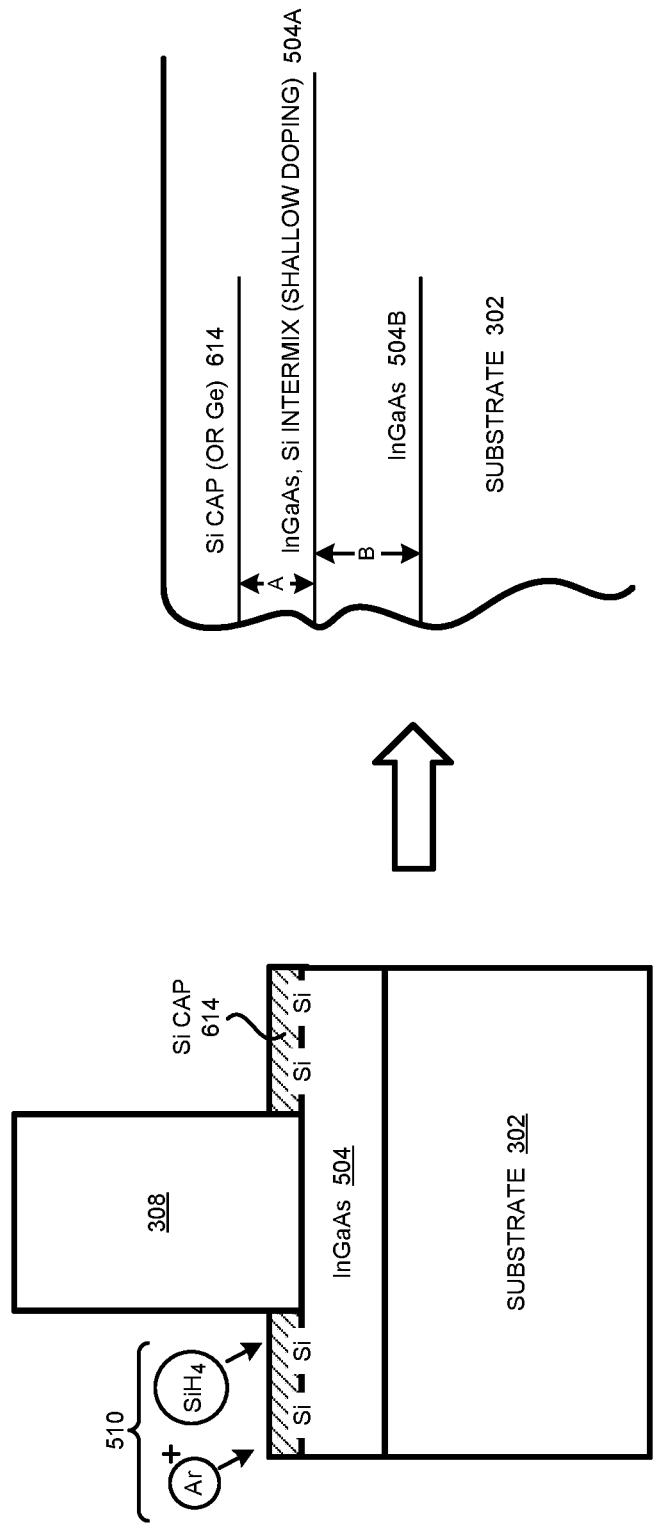
FIG. 6 depicts a depositing of a capping material to control the doping depth in accordance with an illustrative embodiment.

FIG. 6 depicts a depositing of a capping material to control the doping depth in accordance with an illustrative embodiment. Layer 504 is the same as layer 504 in FIG. 5.

By continuing bombarding layer 504 with plasma 510—which includes the plasma material ions, as in plasma 310 of FIG. 3, as well a suitable doping material compound, such as Silane as in FIG. 5, plasma 510 begins to form a layer of the doping material over layer 504.

The depositing forms cap 614. If the doping is of Si, then cap 614 is an Si layer, or Si cap. Depending upon the implementation, the depositing of cap 614 can be achieved by adjusting a concentration of the material used for the doping, e.g., the concentration or amount of Silane used per unit of time, per unit of material of plasma 310, or both, in Si doping. Cap 614 can also be of other material, such as of Ge, and can be deposited using a suitable compound or form of that material in a similar manner.

Layer 504 comprises two distinct portions, to wit, portions 504A and 504B. Portion 504A is called an intermix, and includes molecules of both the III-V material and the dopant. Portion 504B is in substantially the same state as layer 304 in FIG. 3, and includes molecules of the III-V material only. Some negligible amount of dopant molecules can be present in portion 504B without departing from the illustrative embodiments.

Depth "A" of portion 504A is significantly small relative to the total depth (A+B) of layer 504. For example, A is generally of the order of one to thirty percent of (A+B), but can be varied within and outside this example range depending upon the electron mobility needed in a particular implementation.

Plasma 510 continues to be directed at layer 504 during the formation, and for some period after cap 614 is formed. During the formation, as well as once formed, cap 614 restricts, tunes, limits, or otherwise controls the depth reached into layer 504 by the dopant carried in plasma 510. In other words, without cap 614, plasma 510 would cause the dopant to reach a greater-than-desirable depth into layer 504. An embodiment causes cap 614 to be deposited in order to control the depth of portion 504A.

Within the scope of the illustrative embodiments, and depending upon the specific implementation, the speed of depositing cap 614, the height or thickness of cap 614, the sparsity or density of cap 614, or some combination thereof is adjustable to limit the penetration of the dopant into layer 504. For example, an amount of Silane added to plasma 510 can be adjusted to adjust a speed of depositing cap 614. A duration of exposure to plasma 510 can be adjusted to adjust the height of cap 614, a speed of movement of plasma 510 can be adjusted to adjust the density of cap 614.

These examples adjustments in forming cap 614 and controlling depth A of portion 504A are not intended to be limiting. From this disclosure, those of ordinary skill in the art will be able to conceive many other depositing adjustments and the corresponding depth controls, and the same are contemplated within the scope of the illustrative embodiments.

Once cap 614 has served its function in controlling the depth of the shallow doping into the III-V material, cap 614 has served its purpose and has to be removed. The illustrative embodiments recognize that removing cap 614 is a difficult problem. During the shallow doping process, a Si-rich cap, e.g., cap 614, is adjacent to a layer of intermixed Si and III-V material, which is in turn adjacent to a layer of III-V material. The challenge is to remove the Si-rich layer while not removing the intermixed layer at all or with negligible removal of the intermixed layer.

An embodiment causes the fabrication system to prepare a diluted solution of Tetra Methyl Ammonium Hydroxide (TMAH). The dilution can be in the range of twenty to thirty percent of TMAH.

Experimentation has shown that the dilution of twenty-five percent TMAH produces desirable cap erosion results. Therefore, according to a preferred embodiment, the dilution should be at twenty-five percent of TMAH.

The illustrative embodiments also provide that temperature of the diluted TMAH also plays a role in the erosion process. Experimentation supports that twenty-five percent TMAH at room temperature (approximately twenty-to-twenty-five degrees Celsius) according to an embodiment, when exposed to cap 614 for a period of approximately 120 minutes according to the embodiment, eroded cap 614 without attacking or eroding the intermix portion 504A and the III-V material portion 504B. The time to erode or dissolve the cap material is significantly less that the total exposure time.

According to another embodiment, the same dilution of TMAH at fifty-to-sixty degrees Celsius eroded cap 614 in approximately the same amount of time as did the solution at room temperature, and dissolved the III-V material in intermix portion 504A at the rate of approximately eighty-five one-hundredths (0.85) nm per minute in an exposure time of approximately fifteen minutes.

Thus, the illustrative embodiments recognize that the temperature of the diluted TMAH solution and the total exposure time for which the cap is exposed to the TMAH solution are related by an inverse relationship function. Generally, as the temperature of the solution rises by one amount, the exposure time required reduces by another amount. The inverse relationship function at or close to sea level atmospheric pressure satisfies at least the two example data points at room temperature and fifty-to-sixty degrees, as described above. Within the scope of the illustrative embodiments, the function may be different for different temperature bands, different atmospheric pressures, other factors, or some combination thereof.

Accordingly, an embodiment causes the fabrication process to use the rapid solubility of cap material and slow solubility of the III-V material in a diluted TMAH solution to remove cap 614. This method of removing the cap material is referred to as a wet removal process. The embodiment adjusts the exposure time in the wet removal process according to the inverse relationship function of the temperature of the solution. Preferably, the embodiment causes the fabrication system to set the exposure time to no more than fifteen minutes for the solution temperature of fifty-to-sixty degrees of a twenty-five percent TMAH solution.

As an additional advantage, but not necessary for an embodiment to be practiced, the removal of cap 614 using the TMAH solution may also smoothen the physical rough texture created by the plasma doping in layer portion 504.

Figure 7:
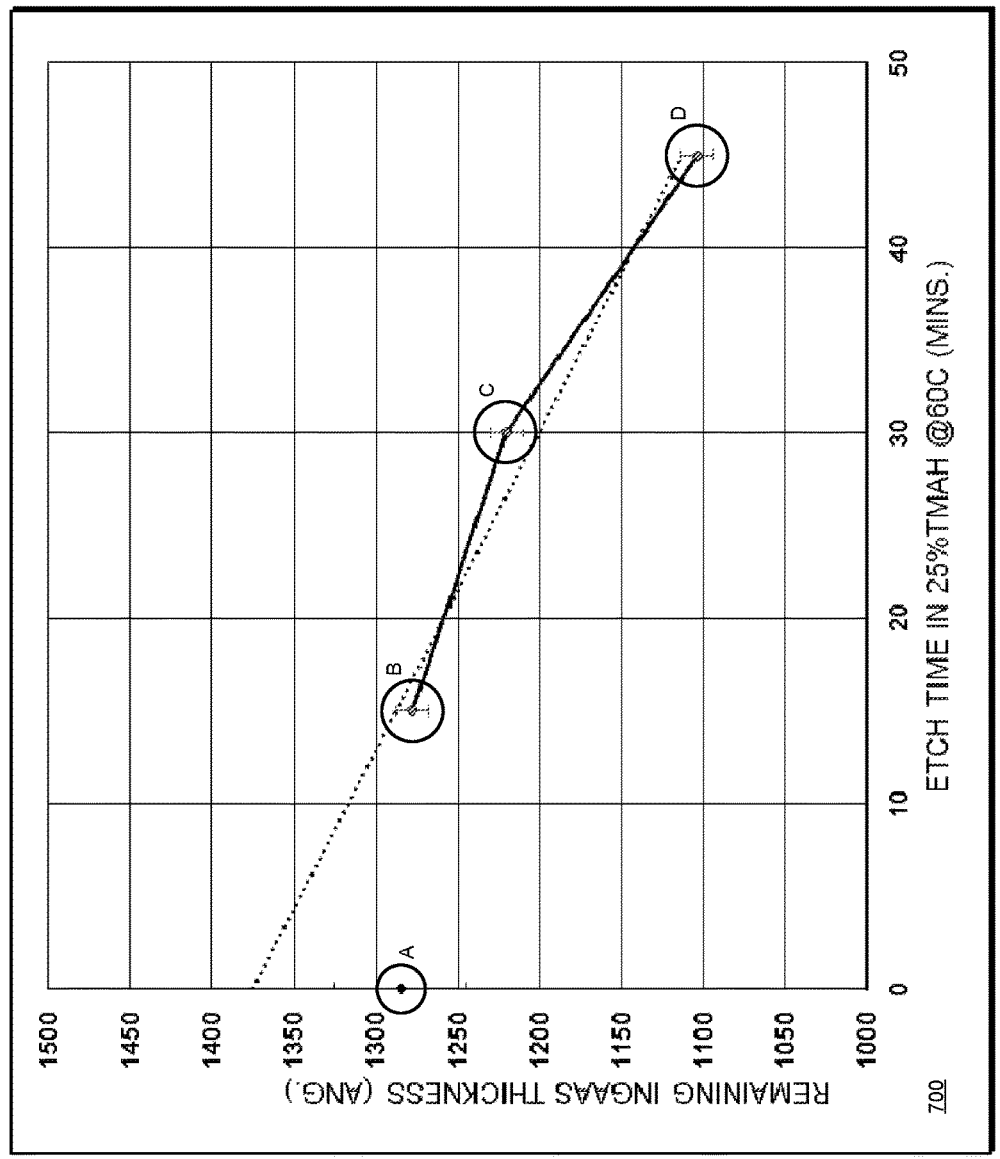
FIG. 7 depicts a graph of III-V material loss using a wet removal process in accordance with an illustrative embodiment.

With reference to FIG. 7, this figure depicts a graph of III-V material loss using a wet removal process in accordance with an illustrative embodiment. As an example, the wet removal process plotted in graph 700 is applied to layer 504 in FIG. 5, which is formed by shallow doping Si into InGaAs. Four example data points are plotted. As an example, a twenty-five percent solution of TMAH at sixty degrees Celsius is used for the exposure.

Data point A shows that at exposure time of zero minutes, the remaining thickness of the InGaAs material is approximately 1270 Angstroms. Data point B shows that at exposure time of fifteen minutes, the remaining thickness of the InGaAs material is still approximately 1270 Angstroms. Data point C shows that at exposure time of thirty minutes, the remaining thickness of the InGaAs material is approximately 1225 Angstroms. Data point D shows that at exposure time of forty-five minutes, the remaining thickness of the InGaAs material is approximately 1100 Angstroms.

At the dissolving rate of InGaAs as plotted in graph 700, the observed dissolving rate of Si was four-to-eight Angstroms/minute. Thus, the experimentation supports a conclusion of an embodiment that a solution of approximately twenty-five percent TMAH at sixty degrees Celsius, when exposed to InGaAs for a period of approximately fifteen minutes will negligibly erode InGaAs while substantially eroding Si of the cap.

Figure 8:
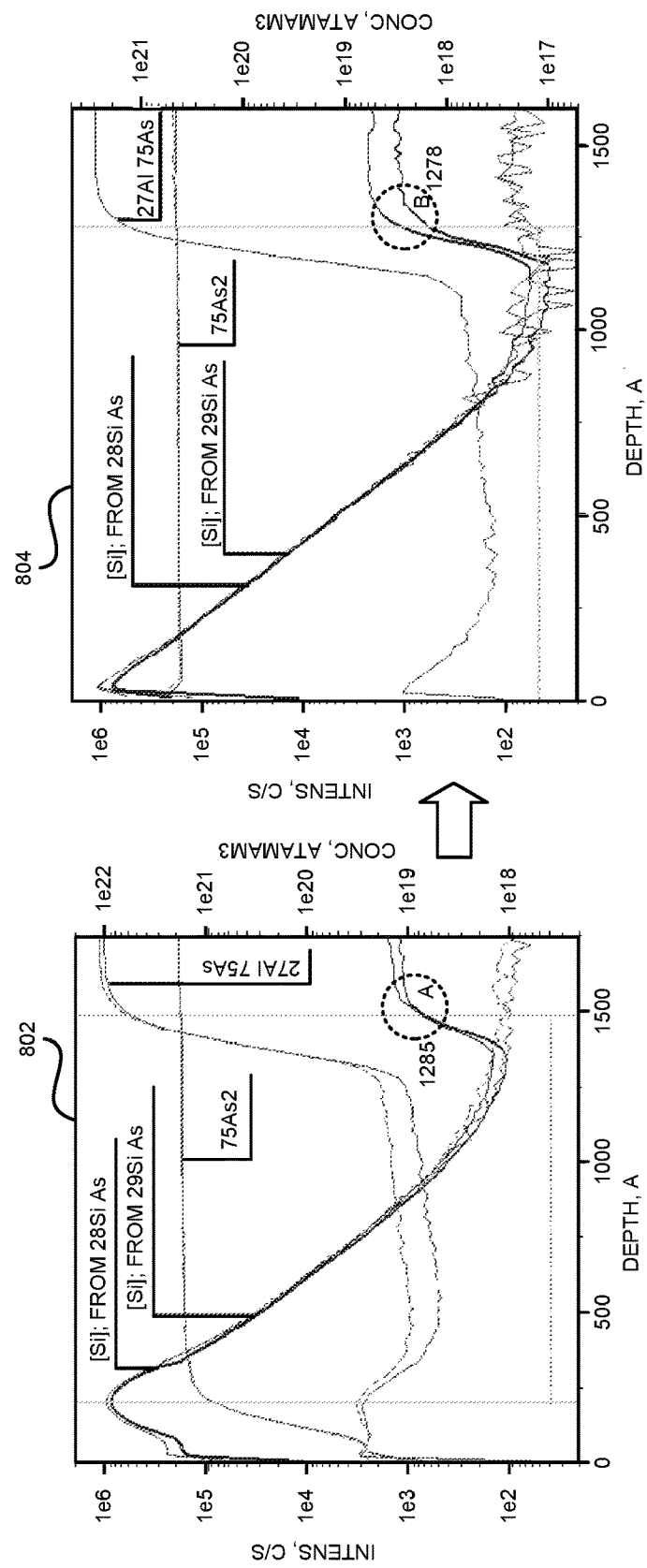
FIG. 8 depicts measurement plots of Si cap thickness reduction through a wet removal process in accordance with an illustrative embodiment.

With reference to FIG. 8, this figure depicts measurement plots of Si cap thickness reduction through a wet removal process in accordance with an illustrative embodiment. As an example, the wet removal process plotted in graph 802 is applied to layer 504 in FIG. 5, which is formed by shallow doping Si into InGaAs. At the onset of the wet removal process, Si thickness—which is monitored by measuring SiAs cluster ions, is measured as reaching up to 1285 angstroms where InGaAs layer begins (area A of graph 802).

Again, as an example, a twenty-five percent solution of TMAH at sixty degrees Celsius is used for an exposure time of fifteen minutes. Area B of graph 804 shows that Si has been effectively removed and 1278 Angstroms of InGaAs thickness still remains. Graph 804 shows that the solution at the temperature and exposure time has only eroded approximately seven Angstroms of InGaAs material while effectively removing all of the Si cap from the Si cap, e.g., from cap 614 in FIG. 6.

Figure 9:
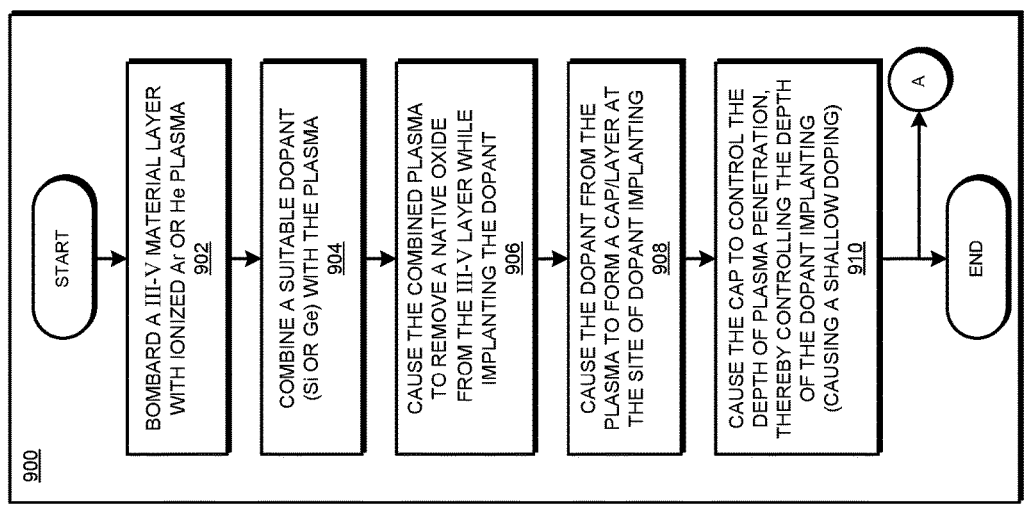
FIG. 9 depicts a flowchart of an example process for in-situ shallow plasma doping in accordance with an illustrative embodiment.

With reference to FIG. 9, this figure depicts a flowchart of an example process for in-situ shallow plasma doping in accordance with an illustrative embodiment. Process 900 can be implemented in application 105 in FIG. 1, to cause the structures similar to layer 504 and cap 614 of FIG. 6 to form.

The application causes a fabrication system to bombard a III-V material layer with ionized Ar or He plasma (block 902). The application causes a fabrication system to combine a suitable dopant, e.g., Si or Ge in a suitable form, with the ionized Ar/He of the plasma (block 904).

The application causes a fabrication system to cause the combined plasma to remove a native oxide from the III-V material layer while implanting the dopant in to the III-V material layer (block 906). The application causes a fabrication system to cause the dopant from the combined plasma to form a cap or a layer at the site of the shallow dopant implanting (block 908).

The application causes a fabrication system to cause the cap to control the depth of the plasma penetration, thereby controlling the depth of the dopant implanting into the III-V material layer (block 910). The application either ends process 900 or exits at exit point "A" to enter process 1000 of FIG. 10 at the corresponding entry point "A".

Figure 10:
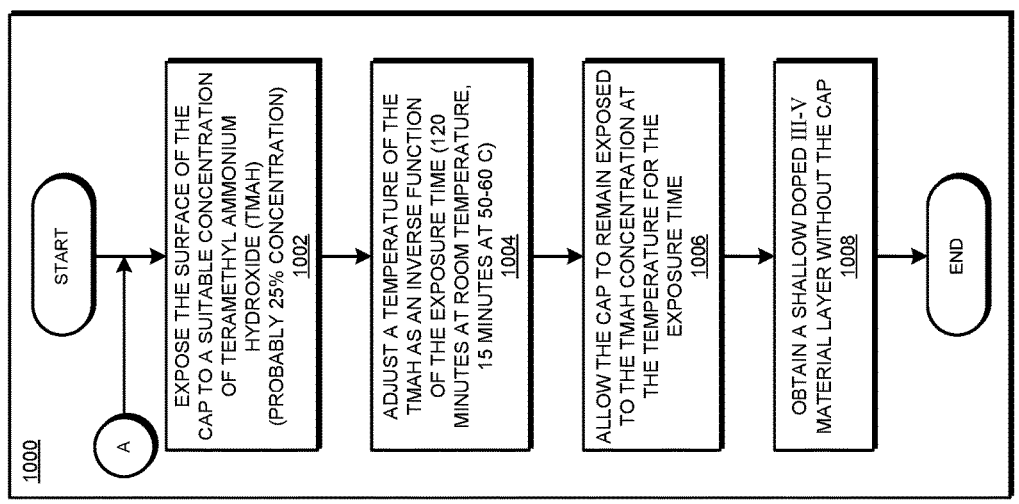
FIG. 10 depicts a flowchart of a wet removal process in accordance with an illustrative embodiment.

With reference to FIG. 10, this figure depicts a flowchart of a wet removal process in accordance with an illustrative embodiment. Process 1000 can be implemented in application 105 in FIG. 1, to remove the capping layer as described with respect to FIGS. 7 and 8.

The application causes a fabrication system to expose the surface of the cap to a suitable concentration of TMAH (block 1002). At the time of the exposure, the application causes a fabrication system to ensure that the temperature of the TMAH solution is set in an acceptable range (block 1004). For example, depending upon the implementation, the implementation may require restricting the exposure time to a certain period. By using the inverse relationship function that is applicable to the implementation environment, the application causes a fabrication system to compute the temperature of the TMAH solution. Conversely, the application causes a fabrication system to set the temperature, e.g., to approximately 60 degrees Celsius, and either sets the exposure time to 15 minutes under circumstances similar to the experiment described herein or computes a different period according to the environment factors of the particular implementation.

The application causes a fabrication system to allow the cap to remain exposed to the TMAH solution at the set temperature for the determined exposure time (block 1006). Upon the elapse of the exposure time, the application causes a fabrication system to obtain a shallow doped III-V material layer without the cap (block 1008). The application ends process 1000 thereafter.

Thus, a computer implemented method, system or apparatus, and computer program product are provided in the illustrative embodiments for plasma shallow doping and wet removal of depth control cap and other related features, functions, or operations.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
ionizing a gas into a plasma;
mixing a compound of a dopant into the plasma, forming a mixed plasma;
exposing, using a semiconductor device fabrication system, a layer of III-V material to the mixed plasma to dope the layer with the dopant up to a depth in the layer, forming a shallow doped portion of the layer;
controlling the depth of the dopant by a second layer of the dopant formed over the shallow doped portion of the layer;
exposing the second layer to a solution, the solution prepared to erode the dopant in the second layer at a first rate; and
removing, after an elapsed period, the solution from the second layer, wherein the elapsed period is sufficient to remove the second layer and insufficient to erode a total depth of the layer and the shallow doped portion by more than a tolerance erosion amount.

2. The method of claim 1, further comprising:
computing, using a processor and a memory, the elapsed period as a function of a temperature of the solution.

3. The method of claim 2, wherein the function is an inverse relationship function.

4. The method of claim 1, wherein the solution is heated to a temperature in a range of twenty to sixty degrees Celsius, inclusive of each end temperature of the range.

5. The method of claim 4, wherein the temperature is in a second range from fifty to sixty degrees Celsius, inclusive of each end temperature of the second range.

6. The method of claim 1, wherein the solution comprises Tetra Methyl Ammonium Hydroxide (TMAH) that has been diluted to a ratio in a range of twenty to thirty percent TMAH, inclusive of each end ratio of the range.

7. The method of claim 6, wherein the ratio is twenty-five percent TMAH.

8. The method of claim 1, further comprising:
adjusting an amount of time the layer is exposed to the mixed plasma to adjust an amount of the dopant in the second layer.

9. The method of claim 1, further comprising:
depositing, using the mixed plasma, the second layer of the dopant over the doped portion of the layer.

10. The method of claim 1, further comprising:
adjusting an amount of the compound mixed into the plasma to adjust a speed of depositing the second layer.

11. The method of claim 1, wherein the shallow doped portion increases an electron mobility in the layer.

12. The method of claim 1, further comprising:
removing, as a part of the exposing the layer to the mixed plasma, oxygen from an oxide molecule in the layer, wherein the removing the oxygen causes the dopant to reach the depth.

13. The method of claim 1, wherein the dopant is Silicon, and wherein the compound is Silane.

14. The method of claim 1, wherein the gas is one of Argon and Helium.

* * * * *